United States Patent [19]

Zrnich

[11] Patent Number: 4,561,711
[45] Date of Patent: Dec. 31, 1985

[54] CONNECTOR SAVER ASSEMBLY

[75] Inventor: Milan Zrnich, Bensenville, Ill.

[73] Assignee: GTE Communication Systems Corporation, Northlake, Ill.

[21] Appl. No.: 685,651

[22] Filed: Dec. 24, 1984

[51] Int. Cl.⁴ ............................................. H05K 1/00
[52] U.S. Cl. ............................. 339/17 C; 339/154 A; 339/176 MP
[58] Field of Search ......... 339/176 MP, 17 C, 17 LC, 339/154, 155, 156, 108 TP

[56] References Cited

U.S. PATENT DOCUMENTS

| | | | |
|---|---|---|---|
| 2,832,942 | 4/1958 | French | 339/156 R |
| 2,952,810 | 9/1960 | Helton | 339/156 R |
| 3,035,244 | 5/1962 | Aveni | 339/156 R |
| 3,364,458 | 1/1968 | Black, Jr. et al. | 339/154 A |
| 3,568,136 | 3/1971 | Wells | 339/156 R |
| 4,490,000 | 12/1984 | Asick et al. | 339/155 R |

Primary Examiner—Gil Weidenfeld
Assistant Examiner—David L. Pirlot
Attorney, Agent, or Firm—Charles A. Doktycz

[57] ABSTRACT

An electrical connector having a base portion duplicating a printed circuit card edge having thereon contacts for mating with a card jack to which is mounted a printed circuit card jack on the edge away from the contact surfaces. The card edge connector portion is plugged into a card jack of a test apparatus after which the attached card jack is the jack into which cards to be tested are inserted.

3 Claims, 3 Drawing Figures

CONNECTOR SAVER ASSEMBLY

FIELD OF THE INVENTION

The present invention relates to printed circuit card connectors and more particularly to connectors that are comprised of a plug end and a printed circuit card jack, to readily connect to a test set as a replaceable jack.

BACKGROUND OF THE INVENTION

In the testing of printed circuit cards, the cards are plugged into a jack of an apparatus designed to test the cards ability to perform its desired function. The repeated insertion of printed circuit cards into the test apparatus jack eventually destroys the jack, resulting in poor connections to the circuit cards desired to be tested. Commercially available jacks have become worn after the insertion of 200 to 300 cards. This amount may be less than a days usage, after which the test apparatus is disabled. To replace such a jack involves the removal and resoldering of a large number of wire conductors frequently over 100. This is an expensive and time consuming operation during which the apparatus is not available.

SUMMARY OF THE INVENTION

Accordingly, it is an object of the present invention to provide an improved electrical connector. More particularly, it is an object to provide an improved electrical connector which can be easily and quickly aligned and connected.

A still further object is to provide improved electrical connectors of the above described type which can be easily installed without involving wiring.

Still another object is to provide improved electrical connectors of the above described type which are simple in construction and relatively easy to fabricate.

The above objectives are accomplished with an electrical connector which comprises generally a base portion which functions as a plug and which has printed thereon a plurality of conductive stripes, and a jack portion having a corresponding plurality of wiring pins arranged in two rows projecting therefrom. The base portion is arranged to fit between the two rows of pins and to have the pins soldered to the printed stripes of the base portion with which they correspond.

The base portion is of a length to extend into a jack and establish electrical contact with the corresponding contacts of the jack into which it is inserted. Thus the cards to be tested can be inserted into the jack of the present invention without causing wear of the jack and the test device.

The invention accordingly comprises the features of construction, combination of elements and arrangement of parts which will be exemplified in the construction hereinafter set forth and the scope of the invention will be indicated in the claims.

BRIEF DESCRIPTION OF THE DRAWING

For a fuller understanding of the nature and objects of the invention, reference may be had to the following detailed description taken in conjunction with the accompanying drawing in which.

DESCRIPTION OF THE PREFERRED EMBODIMENT

Figure 1:
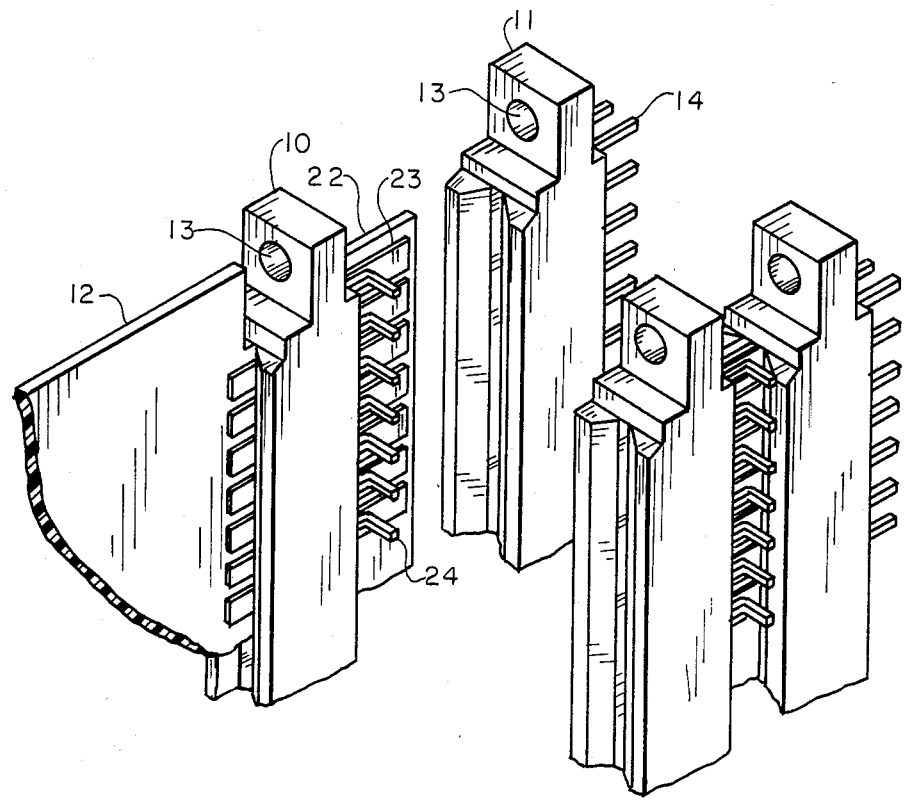
FIG. 1 is a perspective expanded view of the novel connector assembly in position for insertion into a jack assembly of a test apparatus.

Referring to FIG. 1 of the drawing wherein the novel apparatus is designated 10 and is shown in position for insertion into a jack 11, which would normally be a part of a test apparatus. A printed circuit card 12 is shown inserted into the novel apparatus 10.

The first connector 11 is normally rigidly attached to a system backplane or a similar mounting element, the connector 11 has an array of terminating pins 14 rigidly extending from the connector 11 and which protrude through the backplane. The terminating pins 14 are resistant to deformation in directions both perpendicular and parallel to themselves and extend outward from the backplane to a distance great enough to permit their interconnection by a plurality of circuit wires.

Figure 2:
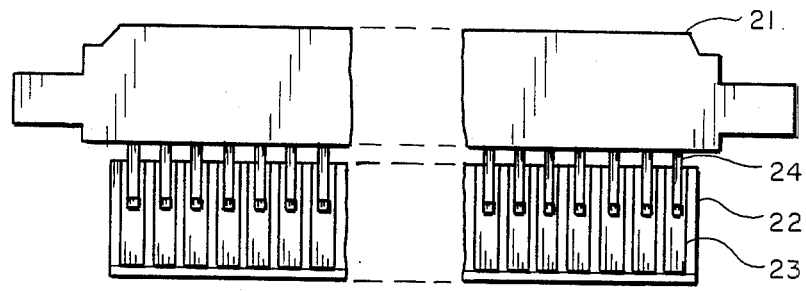
FIG. 2 is a side view of the novel connector saver assembly.
Figure 3:
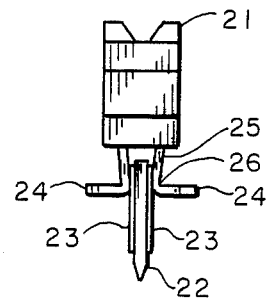
FIG. 3 is an end view of the connector saver assembly.

FIG. 2 shows the novel apparatus as viewed from the side where its component jack assembly 21 and the base portion 22 are visible. The base portion 22 is comprised of a card having plated thereon a plurality of parallel spaced contact surfaces 23 positioned to align with and contact the corresponding members located at the interior of the pins jack assembly 11. The terminal ends of 24 are bent toward the base 22 at point 25 just exterior of the housing block of the jack assembly 21. At the position where they reach and contact the conductive members 23 of the base 22 they are soldered together to provide a good electrical interconnection therebetween. The terminals 24 beyond the area of contact at a point 26 are bent outward so that they project perpendicularly from the surface of the base portion 22. In this position they are readily accessed to serve as test points for the test personnel should this procedure be necessary during the conduct of a test.

This assembly when mounted into an existing jack such as 11 of a test assembly serves to protect the jack from wear. The connector saver assembly such as shown at 10 is readily insertable into the test assembly jack 10 and may be retained therein by appropriate fasteners inserted through the mounting holes 13 found in the jacks of each assembly. When worn it can readily be removed and a new serviceable unit installed without the need for the time consuming task of rewiring.

It will be obvious to those skilled in the art that numerous modifications of the present invention can be made without departing from the spirit of the invention which shall be limited only by the claims appended hereto.

What is claimed is:

1. An arrangement for protecting electrical connectors of an electronic assembly when such an assembly is used to test plugin subassemblies such as printed circuit cards comprising:

a connector of the type used in said electronic assembly having an elongated base with a plurality of connector pins arranged in an array in said base, each pin including a wire terminating portion on a first side of said base, and said base including a slot on the opposing side, said slot dimensioned to receive a terminal end of a printed circuit card, said pins projecting into said slot and arranged to contact corresponding contacts of a printed circuit card, a terminal portion of a printed circuit card, including contact areas corresponding to said contact pins, said connector projecting contact pins electrically connected to corresponding contact areas of said terminal portion of said printed circuit card and include a first bend toward said terminal portion of said printed circuit card and a second bend perpendicular to said terminal card portions to facilitate access thereto for testing, whereby said terminal portion of said printed circuit card may be inserted into said electrical connectors of said electronic assembly and cards to be tested are inserted into the connector of the present arrangement.

2. An arrangement as claimed in claim 1, wherein said second bend is positioned a distance from the edge of said terminal card portion to permit the full insertion of said portion into the connector of the electronic assembly.

3. An arrangement as claimed in claim 2, wherein said connector includes a second array of pins and said terminal portion of said printed circuit card includes a second corresponding plurality of contact areas on a second surface of said portion.

* * * * *